United States Patent
Chu et al.

(10) Patent No.: US 9,543,279 B2
(45) Date of Patent: Jan. 10, 2017

(54) METHOD OF MANUFACTURING A SINGLE LIGHT-EMITTING STRUCTURE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Chia-Hung Chu, Miaoli County (TW); Tsung-Kang Ying, New Taipei (TW); Hou-Te Lee, Kaohsiung (TW); Chia-Ming Tu, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/965,012

(22) Filed: Dec. 10, 2015

(65) Prior Publication Data

US 2016/0099235 A1    Apr. 7, 2016

Related U.S. Application Data

(62) Division of application No. 14/181,821, filed on Feb. 17, 2014, now Pat. No. 9,236,370.

(51) Int. Cl.
*H01L 25/075* (2006.01)
*H01L 25/00* (2006.01)
(Continued)

(52) U.S. Cl.
CPC ........... *H01L 25/0753* (2013.01); *H01L 25/50* (2013.01); *H01L 24/05* (2013.01); *H01L 24/06* (2013.01); *H01L 24/29* (2013.01); *H01L 24/32* (2013.01); *H01L 24/48* (2013.01); *H01L 24/73* (2013.01); *H01L 33/486* (2013.01); *H01L 33/62* (2013.01); *H01L 2224/05554* (2013.01);
(Continued)

(58) Field of Classification Search
CPC ............................. H01L 25/0753; H01L 25/50
See application file for complete search history.

(56) References Cited

U.S. PATENT DOCUMENTS 6,345,903 B1 *   2/2002   Koike ................... H01L 33/486
                                                         257/E33.059

\* cited by examiner

*Primary Examiner* — Whitney T Moore
(74) *Attorney, Agent, or Firm* — Li & Cai Intellectual Property (USA) Office

(57) ABSTRACT

The instant disclosure provides a light-emitting module and a method of manufacturing a single light-emitting structure. The light-emitting module includes two identical light-emitting structures disposed on the same plane. One of the two light-emitting structures disposed on the plane is rotated by 180 degrees relative to the other light-emitting structure, and the two light-emitting structures are connected to each other. Each light-emitting structure includes a base, a conducting element, a light-emitting element and an encapsulation element. The conducting element includes a plurality of conductors separated from each other and passing through the base body, where the number of the conductors is N and N>1. The light-emitting element includes at least one light-emitting chip electrically connected between at least two of the conductors. The encapsulation element includes a transparent encapsulation body disposed on the base to cover the conducting element and the light-emitting element.

17 Claims, 15 Drawing Sheets

(51) Int. Cl.
*H01L 33/48* (2010.01)
*H01L 33/62* (2010.01)
*H01L 23/00* (2006.01)

(52) U.S. Cl.
CPC ............ *H01L 2224/05555* (2013.01); *H01L 2224/0603* (2013.01); *H01L 2224/29339* (2013.01); *H01L 2224/32225* (2013.01); *H01L 2224/48091* (2013.01); *H01L 2224/48227* (2013.01); *H01L 2224/73265* (2013.01); *H01L 2924/00014* (2013.01); *H01L 2924/12041* (2013.01); *H01L 2933/005* (2013.01); *H01L 2933/0033* (2013.01); *H01L 2933/0066* (2013.01)

METHOD OF MANUFACTURING A SINGLE LIGHT-EMITTING STRUCTURE

CROSS REFERENCE TO RELATED APPLICATIONS

This application is a divisional application of Ser. No. 14/181,821 filed on Feb. 17, 2014, and entitled "LIGHT-EMITTING MODULE AND METHOD OF MANUFACTURING A SINGLE LIGHT-EMITTING STRUCTURE THEREOF", now pending, the entire disclosures of which are incorporated herein by reference.

BACKGROUND OF THE INVENTION

1. Field of the Invention

The instant disclosure relates to a method of manufacturing a single light-emitting structure; and in particular to a method of manufacturing a single light-emitting structure.

2. Description of Related Art

For chip type LED package, a plurality of LED chips is usually mounted PCB substrate in array manner. The thickness for PCB substrate has a specific limitation when forming through holes on the side of the PCB substrate. However, the requirement for thinner design cannot be achieved due to the limitation. In order to obtain a single LED package, sawing process is needed to be processed. However, the immediate materials between each of LED packages are generated accordingly. It not only increases the BOM (Bill of material) cost but also requires human labor to separate each of the LED packages from the immediate materials.

SUMMARY OF THE INVENTION

The object of the instant disclosure is to provide a light emitting module which arranges each light-emitting structure to be oriented 180 degrees from another light-emitting structure. From which, the light-emitting structures are interconnected to and the mutual through-holes of the light-emitting structures can be shared with each other, such that no immediate material is created between the two adjacent light-emitting structures. The instant disclosure can effectively reduce the material cost of the base, conducting element and encapsulation element. Moreover, no immediate material is created between the two adjacent light-emitting structures, cutting along the common line of the mutual through-holes between the two adjacent light-emitting structures is sufficient to separate the two light-emitting structures. Therefore, the instant disclosure saves time needed in traditional methods to remove immediate materials from the light-emitting structures.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1A:
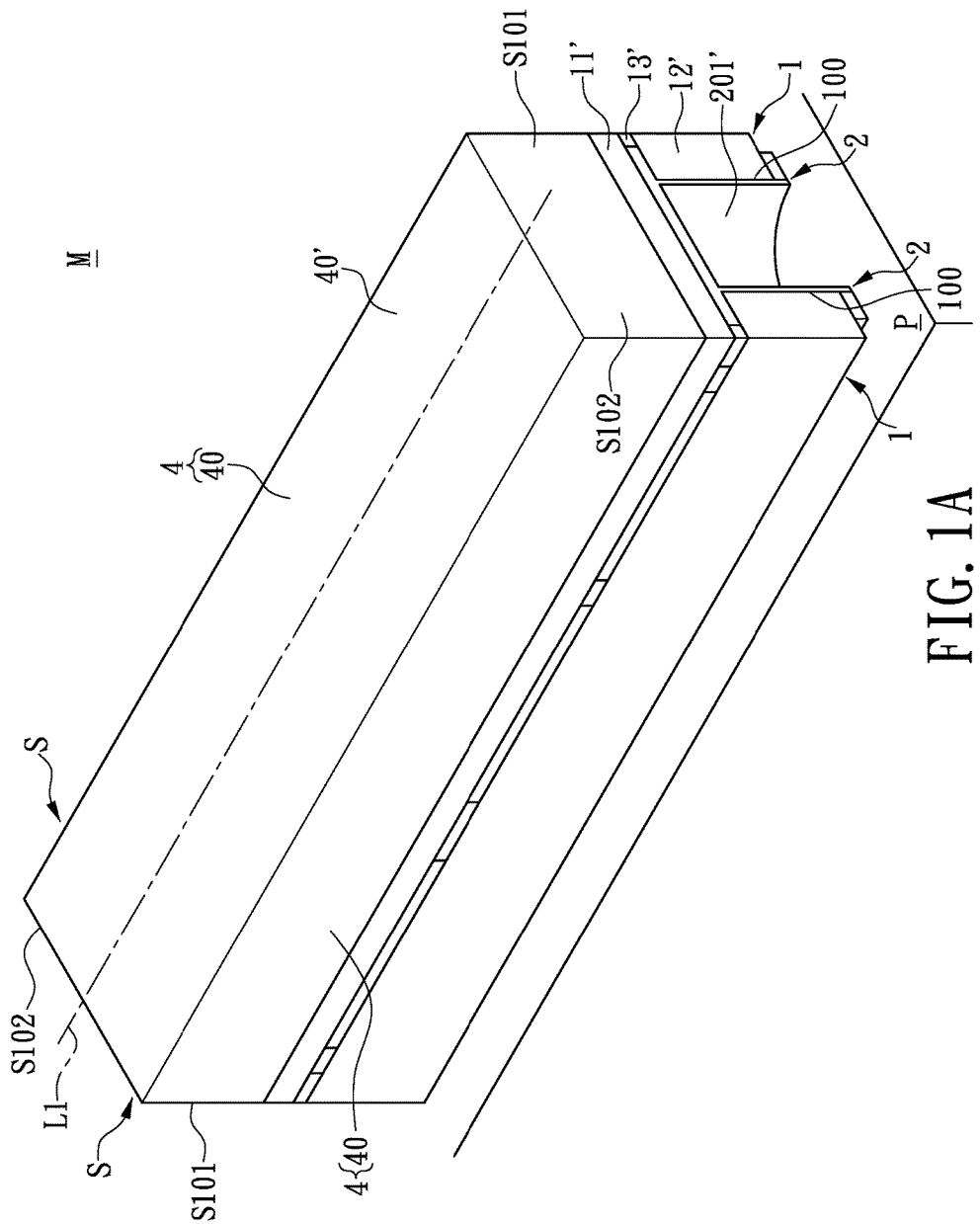
FIG. 1A is a perspective schematic diagram from one angle of a light-emitting module before being cut along the common line according to the instant disclosure.
Figure 1B:
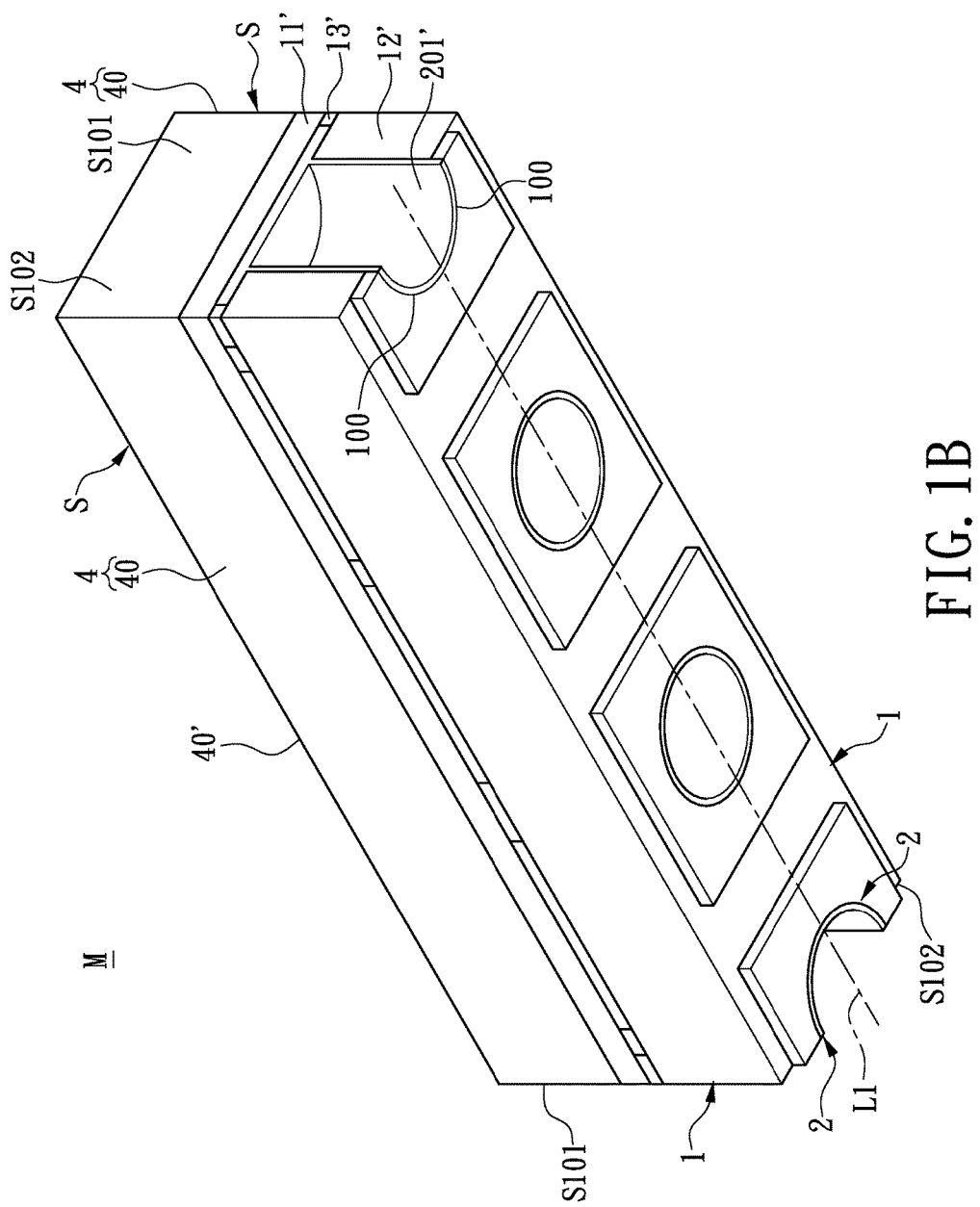
FIG. 1B is a perspective schematic diagram from another angle of a light-emitting module before being cut along the common line according to the instant disclosure.
Figure 2A:
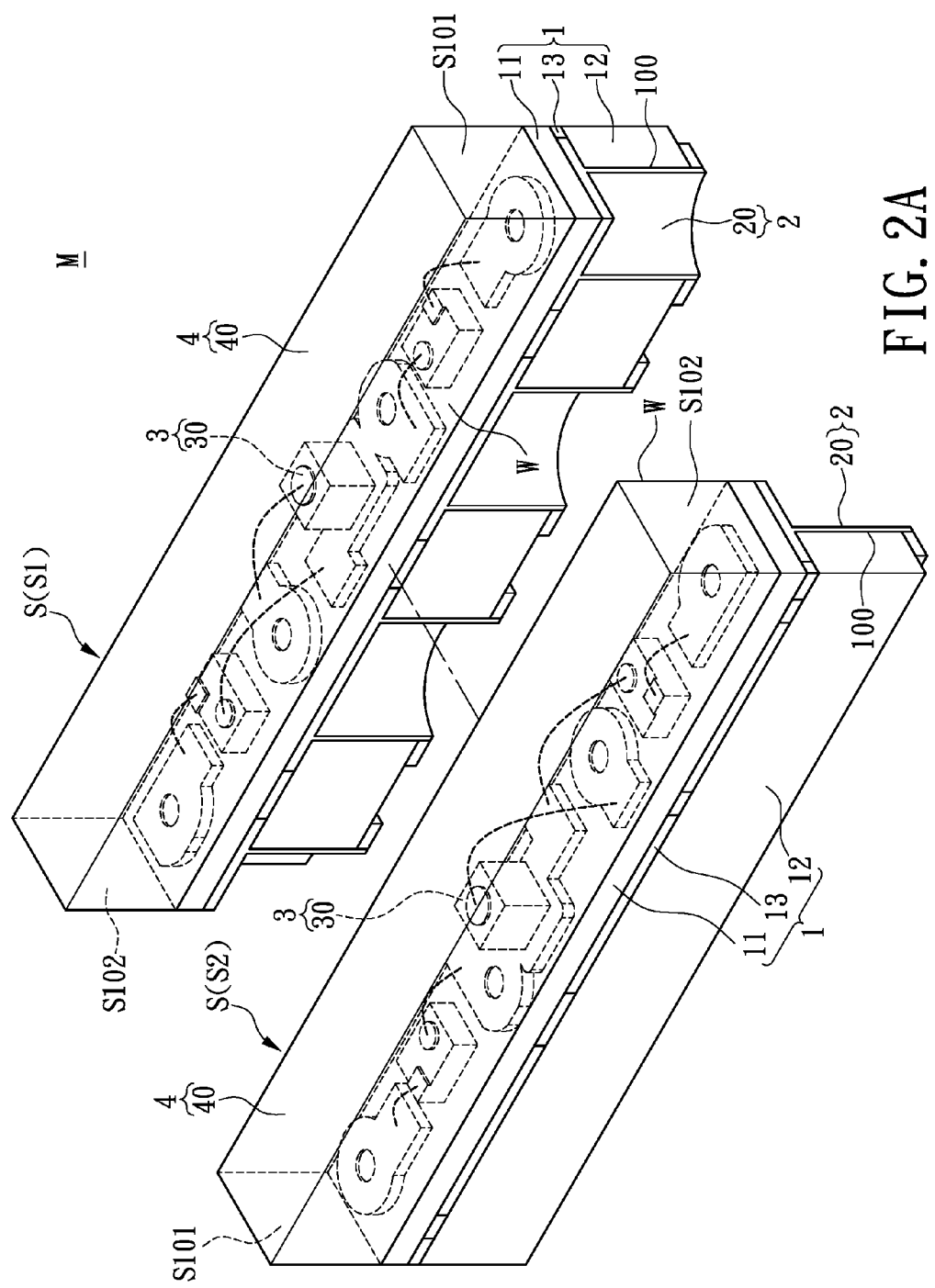
FIG. 2A is a perspective schematic diagram from one angle of a light-emitting module after being cut along the common line according to the instant disclosure.
Figure 2B:
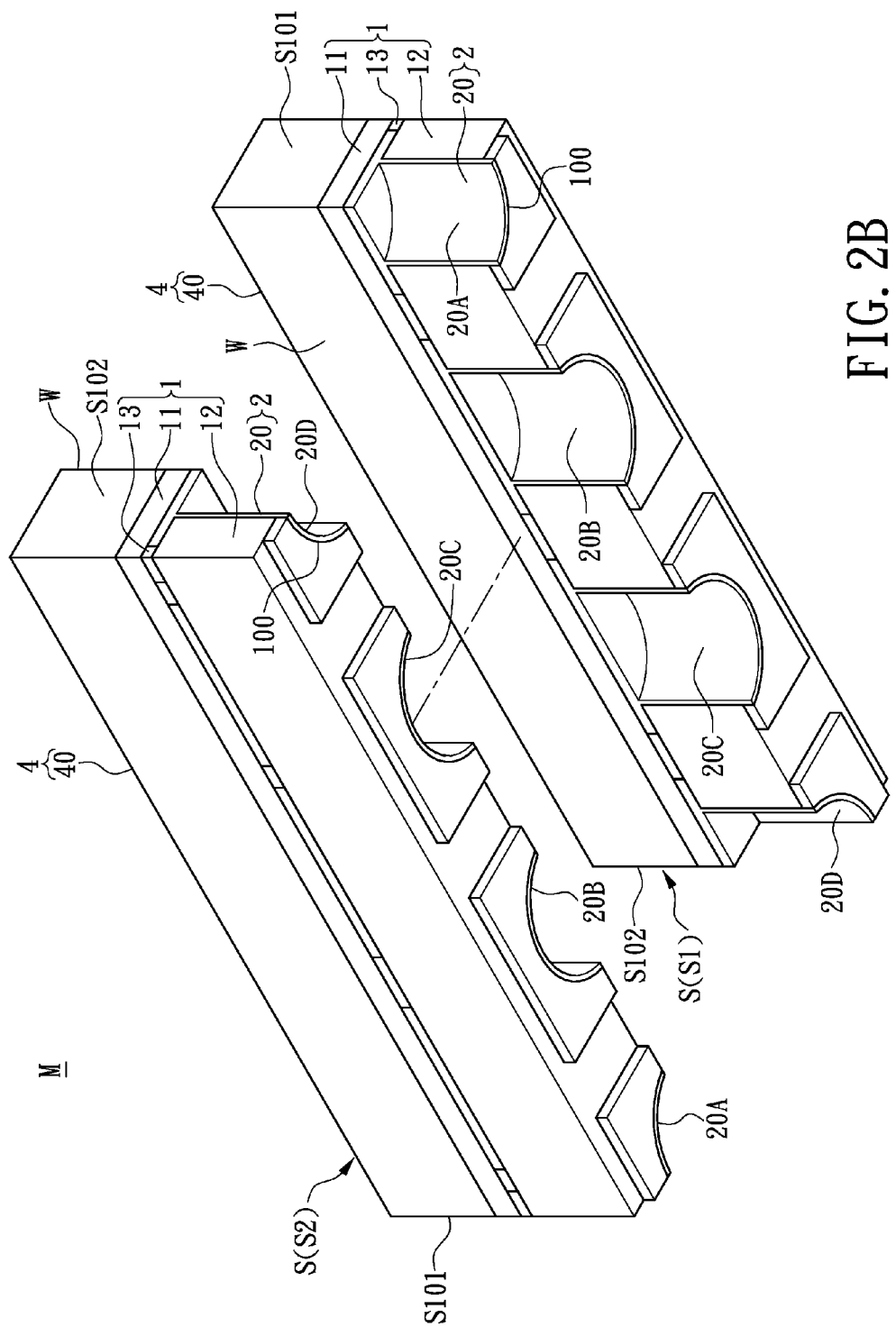
FIG. 2B is a perspective schematic diagram from another angle of a light-emitting module after being cut along the common line according to the instant disclosure.

FIG. 1A and FIG. 1B are respectively perspective views from different angles of a light-emitting module M before cutting. FIG. 2A and FIG. 2B are respectively perspective views from different angles of a light-emitting module M after cutting.

First, after cutting the light-emitting module M along the common line L1 shown in FIG. 1A and FIG. 1B, the light-emitting module M forms two separate light-emitting structures S identical in shape and size (as shown in FIG. 2A and FIG. 2B). Each light-emitting structure S includes a base 1, a conducting element 2, a light-emitting element 3 and an encapsulation element 4. Each light-emitting structure S has a first end S101 and a second end S102 opposite to the first end S101. The first end S101 and the second end S102 are respectively end faces on opposite sides with short edges. Additionally, the conducting element 2 includes N conductors 20 separately passing through the base 1, wherein n is a positive integer greater than 1. The light-emitting element 3 includes a plurality of light-emitting diode chips. Each light-emitting diode chip is electrically connected to at least two of the N conductors 20. The encapsulation element 4 includes a transparent encapsulation body 40 disposed on the base 1 for covering the conducting element 2 and the light-emitting element 3.

When the light-emitting module M has not been cut along the common line L1 such that the two light-emitting structures S are still connected (as shown in FIG. 1A and FIG. 1B, the two light-emitting structures S are connected to each other along their respective sides having a long edge), if the two light-emitting structures S are disposed on a plane P, one of the light-emitting structures S on the plane P is rotated by 180 degrees relative to the other light-emitting structure S, and the first end S101 and the second end S102 of one light-emitting structure S are respectively connected with the second end S102 and the first end S101 of the other light-emitting structure S, such that the face on the first end S101 of one light-emitting structure S lies on the same plane as the face on the second end S102 of the other light-emitting structure S. In the present state for the light-emitting module M, the two bases 1 of the two light-emitting structures S are likewise connected, the two conducting elements 2 of the two light-emitting structures S are likewise connected, and the two transparent encapsulation bodies 40 of the two light-emitting structures S are likewise connected to form a single encapsulation structure 40'.

Furthermore, the base 1 of each light-emitting structure S includes a first substrate 11, a second substrate 12 and an interconnection layer 13. Therefore, when the two light-emitting structures S are connected to each other, the two first substrates 11 of the two light-emitting structures S are connected to each other to form a single first substrate structure 11', the two second substrates 12 of the two light-emitting structures S are connected to each other to form a single second substrate structure 12', and the two interconnection layers 13 of the two light-emitting structures S are connected to each other to form a single interconnection layer structure 13'. Additionally, the N conductors 20 of a light-emitting structure S are sequentially arranged along a direction from the first end S101 to the second end S102, and are defined according to an arithmetic sequence with a difference of 1, i.e. 1st, 2nd, 3rd . . . nth. The nth conductors 20 of the other light-emitting structure S are sequentially arranged along a direction from the second end S102 to the first end S101, and are defined according to an arithmetic sequence with a difference of −1, i.e. nth . . . 3rd, 2nd, 1st. Therefore, when the two light-emitting structures S are connected to each other, the conductors 20 on one light-emitting structure S defined as 1st, 2nd, 3rd . . . nth are respectively connected to the conductors on the other light-emitting structure S defined as nth . . . 3rd, 2nd, 1st.

For example, referring to FIG. 2A and FIG. 2B, the two identical light-emitting structures S can be divided into a first light-emitting structure S1 and a second light-emitting structure S2. The first light-emitting structure S1 has a 1st conductor 20A, a 2nd conductor 20B, a 3rd conductor 20C and a 4th conductor 20D, and the second light-emitting structure S2 has a 1st conductor 20A, a 2nd conductor 20B, a 3rd conductor 20C and a 4th conductor 20D. In addition, the 1st conductor 20A of the first light-emitting structure S1 is connected to the 4th conductor 20D of the second light-emitting structure S2, the 2nd conductor 20B of the first light-emitting structure S1 is connected to the 3rd conductor 20C of the second light-emitting structure S2, the 3rd conductor 20C of the first light-emitting structure S1 is connected to the 2nd conductor 20B of the second light-emitting structure S2, and the 4th conductor 20D of the first light-emitting structure S1 is connected to the 1st conductor 20A of the second light-emitting structure S2.

In other words, when the light-emitting module M has not been cut such that the two light-emitting structures S are still connected to each other (as shown in FIG. 1A and FIG. 1B), the two light-emitting structures S are disposed on the same plane P and are rotated relative to each other by 180 degrees, relative to the common line L1 of FIG. 1A and FIG. 1B (namely using the common line L1 as a frame of reference), the two light-emitting structures S are reversed relative to each other front to back and left to right. The front-to-back direction is the extension direction of a short edge of the light emitting structures S, the left-to-right direction is the extension direction of a long edge of the light-emitting structures S, and the two identical light-emitting structures S are connected to each other with the long edge of the base 1.

In summary, the two bases 1 of the two light-emitting structures S are connected to each other, the two conducting elements 2 of the two light-emitting structures S are connected to each other, and the two encapsulation elements 4 of the two light-emitting structures S are connected to each other. Therefore, no intermediate material is created between the two adjacent light-emitting structures S, effectively reducing the material cost of the bases 1, the conducting elements 2 and the encapsulation elements 4. Moreover, no intermediate material is created between the two adjacent light-emitting structures S, the two light-emitting structures S can be separated by cutting the light-emitting module M along the common line L1 as shown in FIG. 1A and FIG. 1B. Therefore, the instant disclosure further saves selection time of filtering waste materials from light-emitting structures in traditional methods.

Figure 3A:
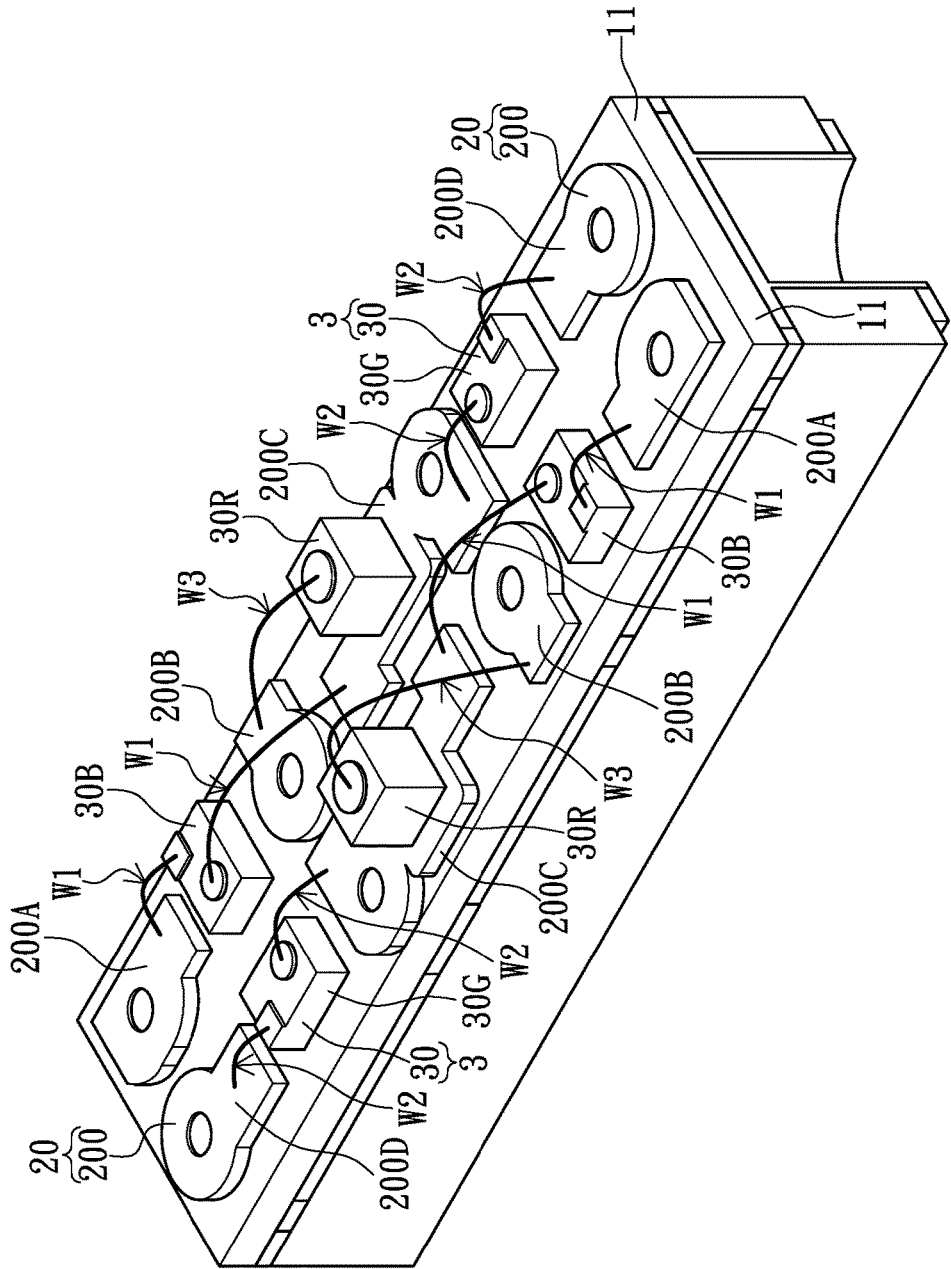
FIG. 3A is a perspective schematic diagram after removing the encapsulation element of FIG. 1A according to the instant disclosure.
Figure 3B:
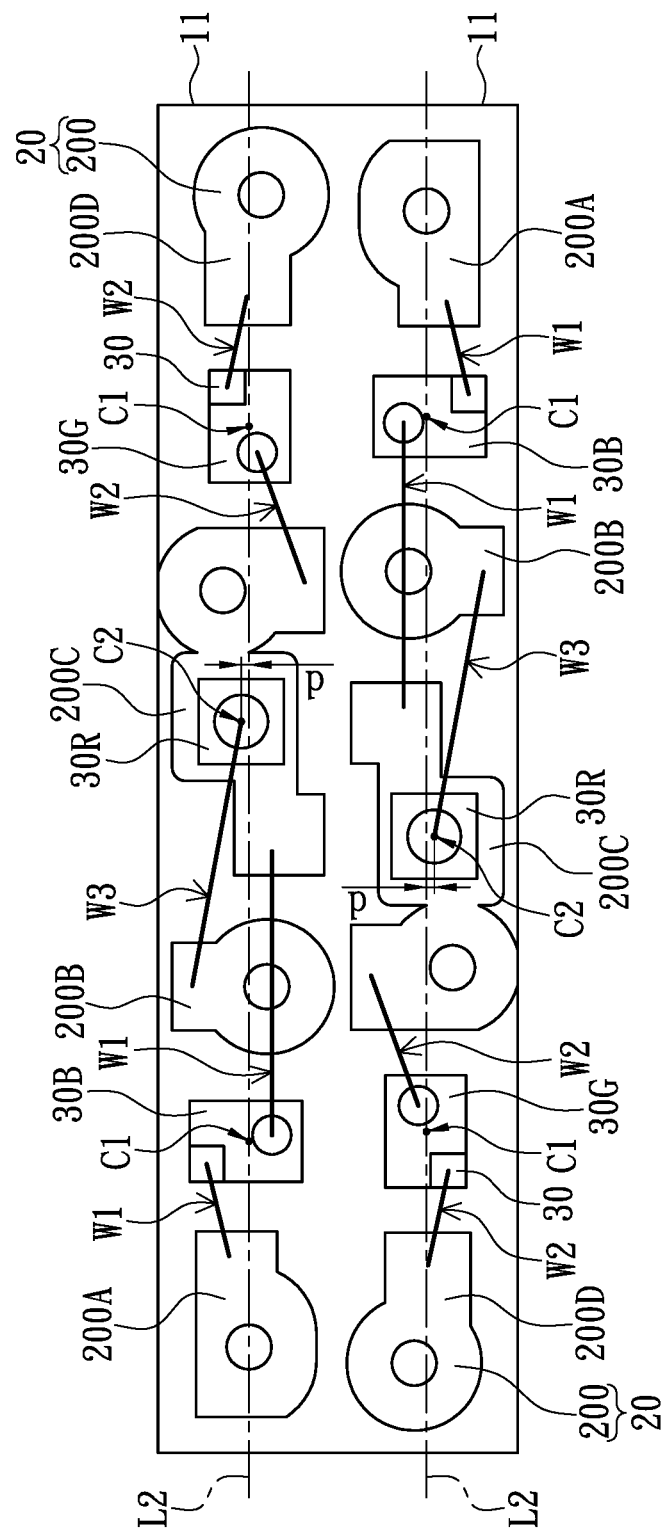
FIG. 3B is a top view schematic diagram after removing the encapsulation element of FIG. 1A according to the instant disclosure.

FIG. 3A and FIG. 3B are respectively a perspective view and a top view of the first embodiment in FIG. 1A after removing the encapsulation element 4.

Referring to FIG. 2A, FIG. 3A and FIG. 3B, each of the conductors 20 includes a chip bond pad 200 disposed on top of the first substrate 11 of the base 1. The chip bond pads 200 of the $1^{st}$, $2^{nd}$, $3^{rd}$ . . . $n^{th}$ conductors 20 of one of the light-emitting structures S are respectively separated from the chip bond pads 200 of the $n^{th}$ . . . $3^{rd}$, $2^{nd}$, $1^{st}$ conductors 20 of the other light-emitting structures S. Each light-emitting diode chip 30 is electrically connected between two chip bond pads 200 of two corresponding conductors 20. Additionally, the transparent encapsulation body 40 is disposed on top of the first substrate 11 of the base 1 to completely encapsulate the chip bond pads 200, so that the chip bond pads 200 are not exposed outside the transparent encapsulation body 40. Therefore, the instant disclosure can prevent water vapor from seeping through the chip bond pads 200 into the functional region or the wiring region of the light-emitting structure S, increasing product reliability. In FIG. 2A, the transparent encapsulation body 40 is rectangular but is not limited thereto. For example, the instant disclosure can consider different optical factors and design a lens-structured transparent encapsulation body 40 to completely encapsulate the chip bond pad 200.

First, for example, the instant disclosure uses 3 light-emitting diode chips 30, which are a vertical red LED chip 30R (the top and bottom surfaces each have one electrode), a horizontal green LED chip 30G (the top and bottom surfaces each have two electrodes, and a horizontal blue LED chip 30B. The blue LED chip 30B and the green LED chip 30G are both disposed on top of the first substrate 11 of the base 1, and the red LED chip 30R is disposed on the corresponding chip bond pad of the conductor 20. More specifically, the blue LED chip 30B and the green LED chip 30G are directly disposed on top of the substrate 11 of the base 1, so that the instant disclosure can save the space required by bonding pads for carrying blue LED chips 30B and green LED chips 30G, thereby achieving a thin design. The chip bond pad 200 of the instant disclosure is displaced a definite distance from the edge of the first substrate 11, completely avoiding the risk of short circuit between the chip bonding pad and the soldered pad 201 due to exposure of the chip bonding pad. Referring to FIG. 3A, the arrangement order of the light-emitting diode chips 30 on one of the light-emitting structures S is 30B, 30R, and 30G The arrangement order of the light-emitting diode chips 30 on the light-emitting structure S rotated by 180 degrees is 30G 30R, 30B. The arrangement order of the chip bond pads 200 on one of the light-emitting structures S is 200A, 200B, 200C, 200D. The arrangement order of the chip bond pads 200 on the light-emitting structure S rotated by 180 degrees is 200D, 200C, 200B, 200A. Namely, the two light-emitting structures S are reversed relative to each other front to back and left to right. It is worth noting that the blue LED chip 30B is rotated 90 degrees relative to the green LED chip 30G when disposed on top of the first substrate 11, effectively reducing the length of the light-emitting structure S and facilitating the wiring between the blue LED chip 30B and a chip bond pad 200C. The product reliability is not affected because the first wire W1 and the third wire W3 are not in contact with each other.

Moreover, for example, the instant disclosure uses 4 chip bond pads 200, which can be a first cathode 200A, a second cathode 200B, an anode 200C, and a third cathode 200D. The blue LED chip 30B can be electrically connected to the first cathode 200A and the anode 200C by two first wires W1. The green LED chip 30G can be electrically connected to the third cathode 200D and the anode 200C by two second wires W2. The bottom of the red LED chip 30R can be directly electrically connected to the anode 200C, and the top of the red LED chip 30R can be electrically connected to the second cathode 200B by a third wire W3. More specifically, the bases 1 each has a center line L2 connecting the first end S101 and the second end S102 of the corresponding light-emitting structure S (as shown in FIG. 3B). The center points C1 of the blue LED chips 30B and the green LED chips 30G can be located on the center lines L2. The center points C2 of the red LED chips 30R disposed on the chip bond pad 200 can be offset from the center line L2 by a predetermined distance d. The predetermined distance d is preferably 15% of the width of a single light-emitting structure and the predetermined distance d is substantially 15% of a short edge of the base 1, but the instant disclosure is not limited thereto. Therefore, when the red LED chip 30R is electrically connected to the second cathode 200B by the third wire W3, the offset distance d between the center line L2 and the center point C2 of the red LED chip 30R prevents contact between the third wire W3 and the first wire W1 electrically connecting the blue LED chip 30B and the anode 200C, reducing the chances of short circuit. Moreover, the center point C2 of the red LED chip 30R is offset from the center line L2 by a predetermined distance d in the direction away from the soldered pad 201, so when the die attach adhesive (such as silver gel, not shown in the figures) coated under the red LED chip 30R is exposed, the exposed die attach adhesive is further away from the soldered pad 201 so that no short circuit occurs therebetween after soldering (such as tinning) is soldered onto the soldered pad 201.

Figure 4A:
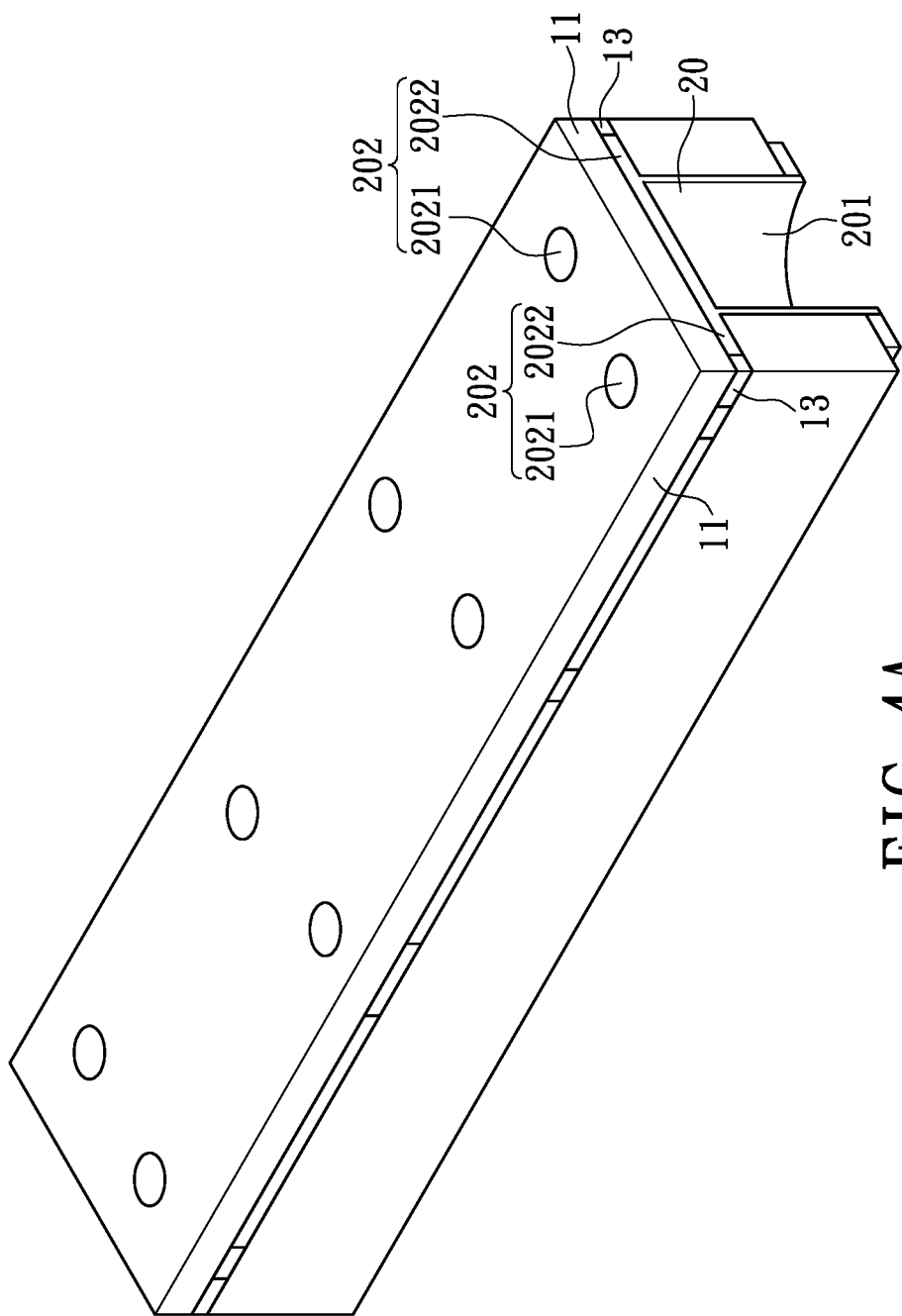
FIG. 4A is a perspective schematic diagram after removing the light-emitting element and the chip bond pads of FIG. 3A according to the instant disclosure.
Figure 4B:
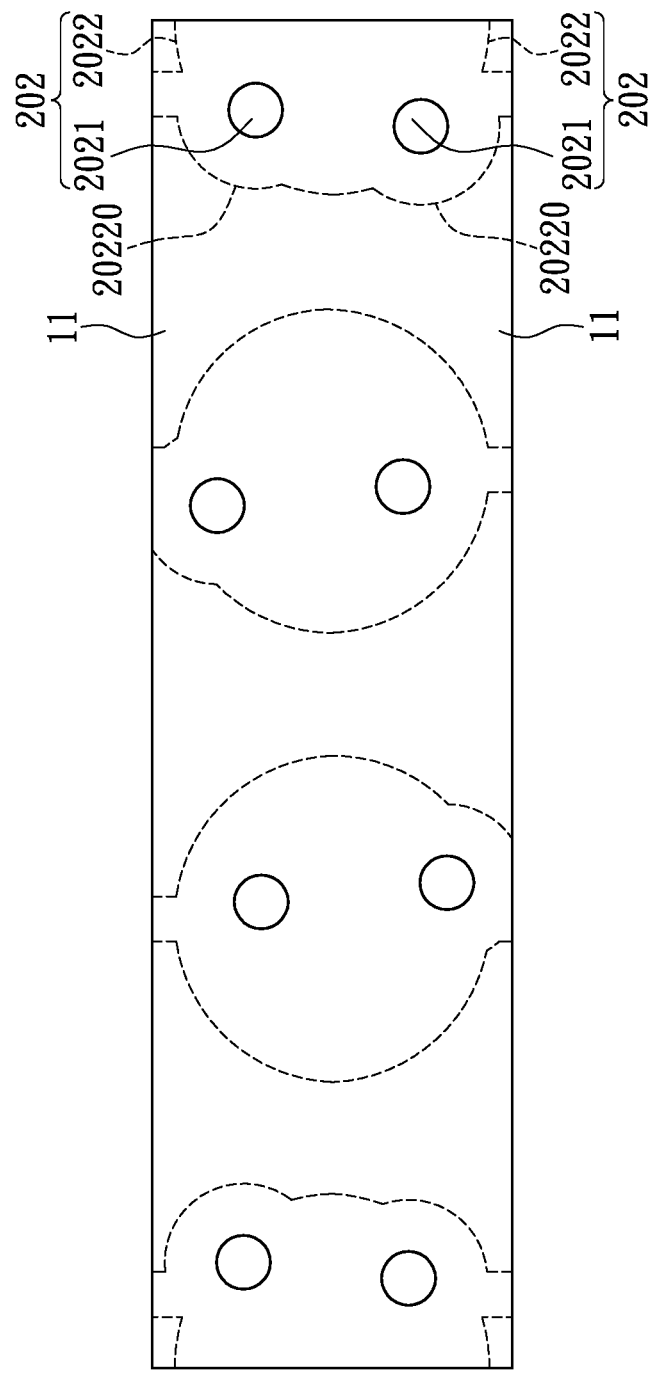
FIG. 4B is a top view schematic diagram after removing the light-emitting element and the chip bond pads of FIG. 3B according to the instant disclosure.
Figure 5A:
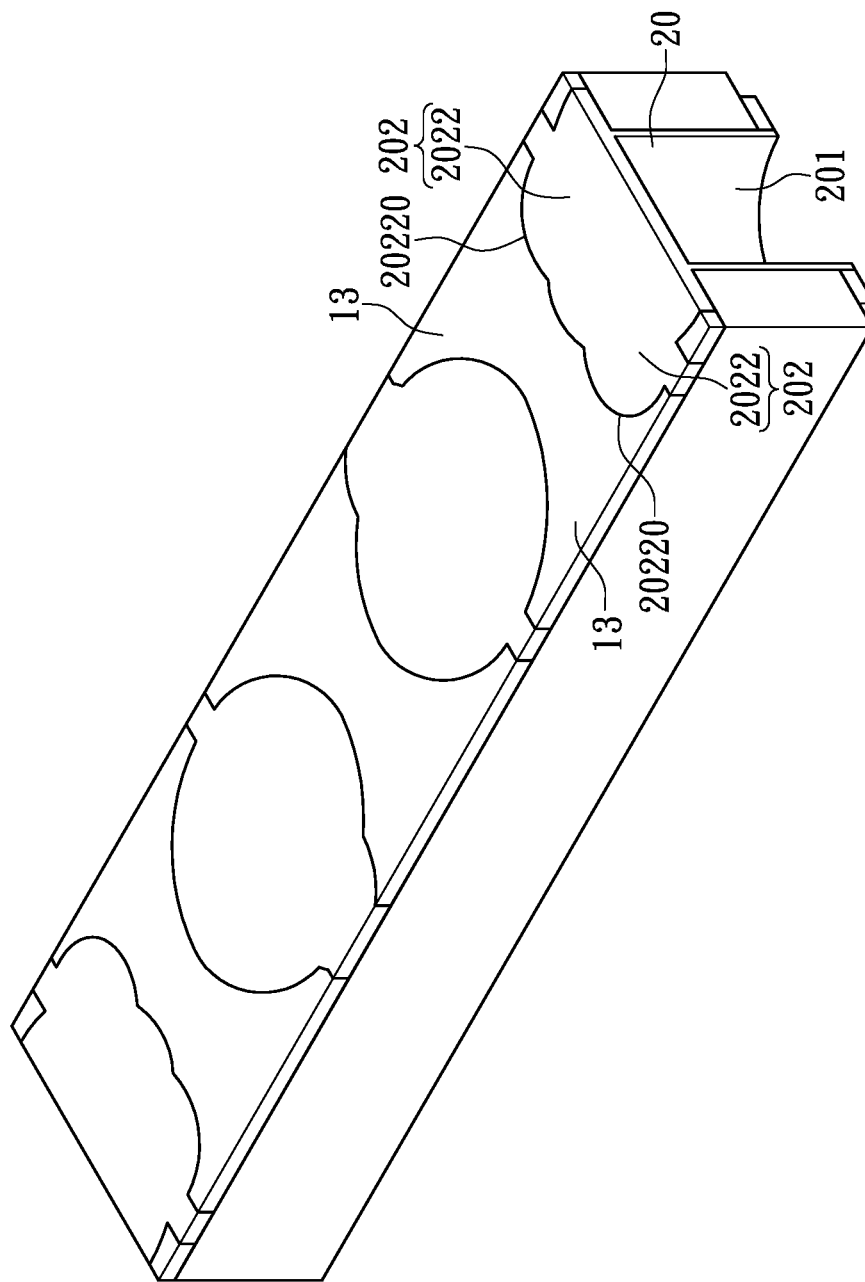
FIG. 5A is a perspective schematic diagram after removing the first substrate and the first connecting portion of FIG. 4A according to the instant disclosure.
Figure 5B:
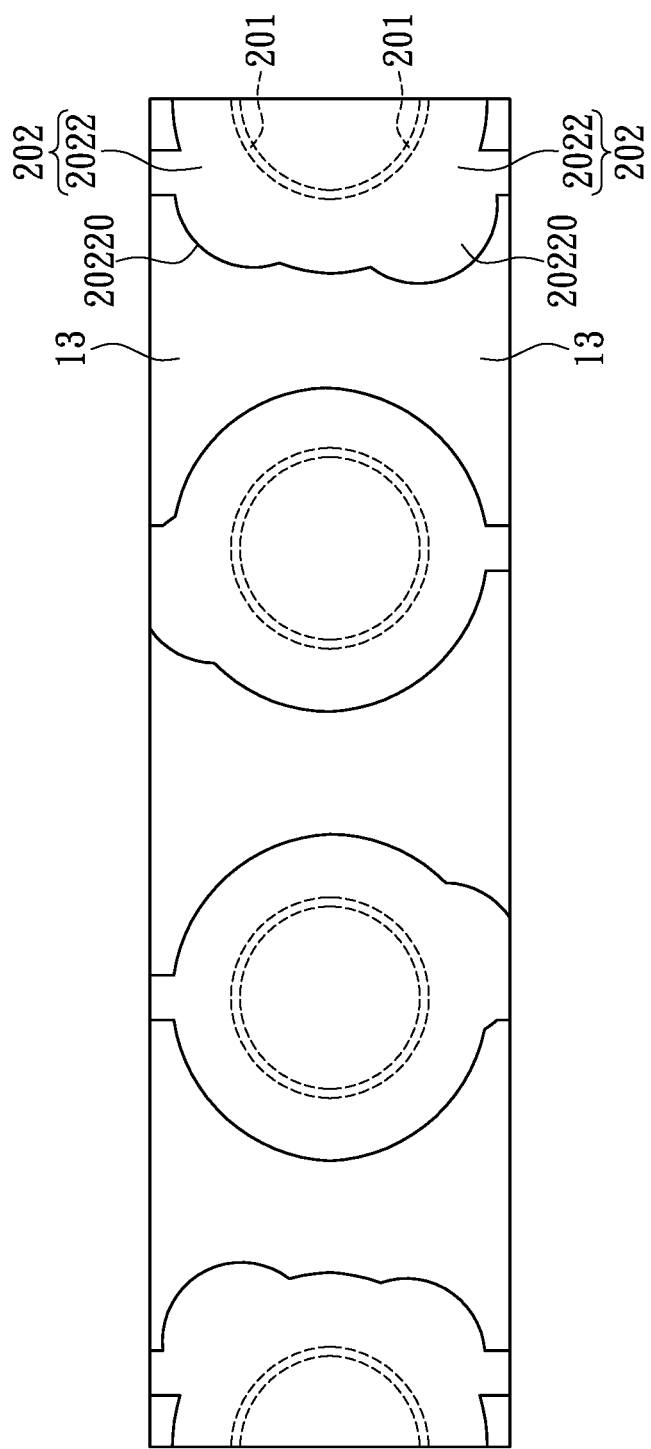
FIG. 5B is a top view schematic diagram after removing the first substrate and the first connecting portion of FIG. 4B according to the instant disclosure.
Figure 6A:
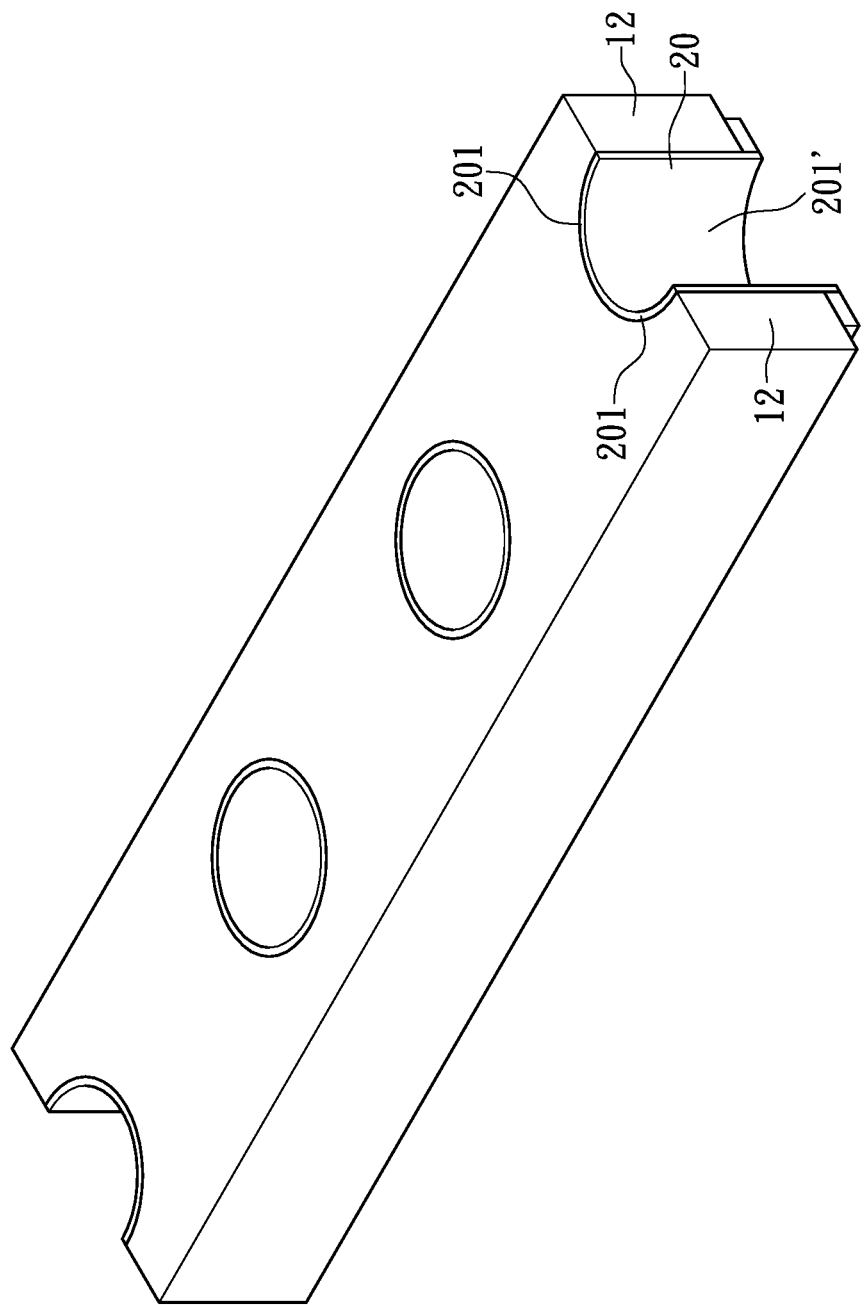
FIG. 6A is a perspective schematic diagram after removing the second connecting portion and the interconnection layer of FIG. 5A according to the instant disclosure.
Figure 6B:
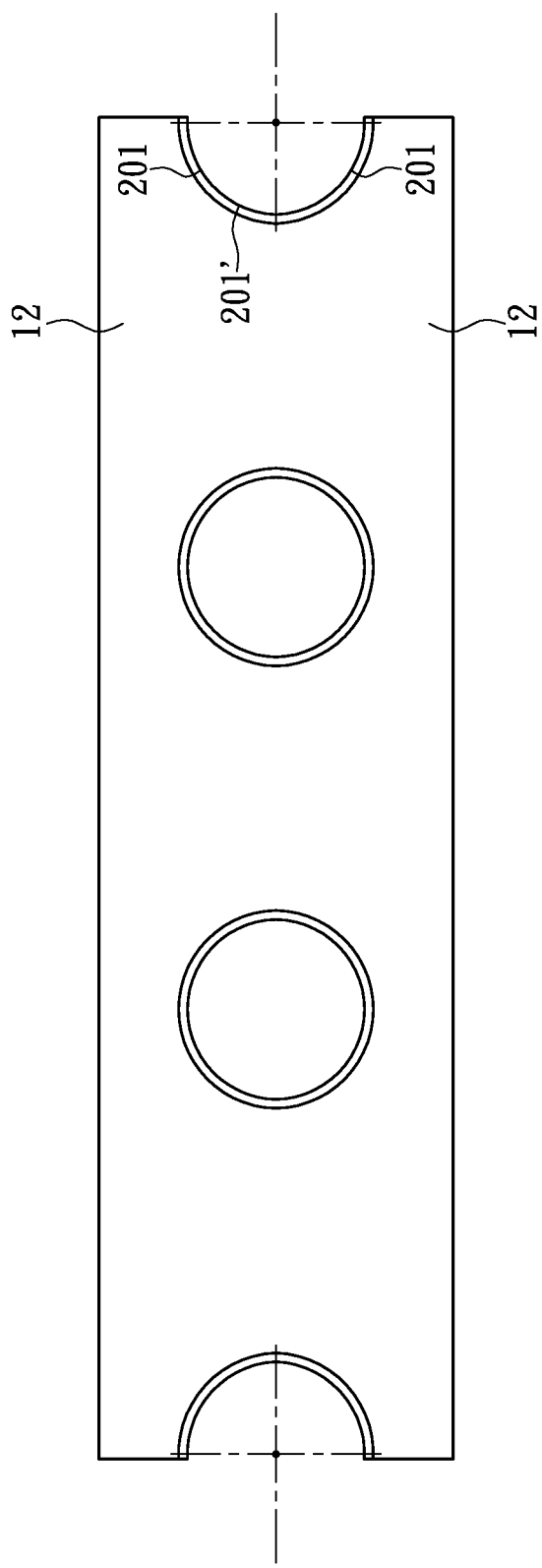
FIG. 6B is a top view schematic diagram after removing the second connecting portion and the interconnection layer of FIG. 5B according to the instant disclosure.

FIG. 4A and FIG. 4B are respectively a perspective view and a top view of the first embodiment in FIG. 3A and FIG. 3B after removing light-emitting elements and chip bond pads. FIG. 5A and FIG. 5B are respectively a perspective view and a top view of the first embodiment in FIG. 4A and FIG. 4B after removing the first connecting portion 2021 and the first substrate 11. FIG. 6A and FIG. 6B are respectively a perspective view and a top view of the first embodiment in FIG. 5A and FIG. 5B after removing the second connecting portion 2022 of the connector 202 and the interconnection layer 13.

Referring to FIG. 4A to FIG. 6B, each of the conductors 20 includes a soldered pad 201 exposed from the bottom of the base 1 and disposed on the lateral side and the underside of the second substrate 12 (as shown in FIG. 6A and FIG. 6B), and a connector 202 connected between the chip bond pad 200 and the soldered pad 201 (as shown in FIG. 4A to FIG. 5B).

First, as shown in FIG. 4A to FIG. 5A, the connector 202 has a first connecting portion 2021 connected to the chip bond pad 200 and passing through the first substrate 11, and a second connecting portion 2022 connected between the first connecting portion 2021 and the soldered pad 201 and passing through the interconnection layer 13. More specifically, referring to FIG. 4B and FIG. 5B, the first connecting portions 2021 of the connectors 202 of the $1^{st}$, $2^{nd}$, $3^{rd}$ ... nth conductors 20 of one of the light-emitting structures S are respectively separated from the first connecting portions 2021 of the connectors 202 of the nth ... $3^{rd}$, $2^{nd}$, $1^{st}$ conductors 20 of the other light-emitting structure S. The second connecting portions 2022 of the connectors 202 of the $1^{st}$, $2^{nd}$, $3^{rd}$ ... nth conductors 20 of one of the light-emitting structures S respectively connect to the second connecting portions 2022 of the connectors 202 of the nth ... $3^{rd}$, $2^{nd}$, $1^{st}$ conductors 20 of the other light-emitting structure S. Additionally referring to FIG. 4B and FIG. 5B, an expansion portion 20220 expands at a periphery of the second connecting portion 2022 around and away from a region proximal to the first connecting portion 2021 so that the first connecting portion 2021 can contact the second connecting portion 2022 given a margin of error.

Moreover, referring to FIG. 6A and FIG. 6B, the soldered pads 201 of the $1^{st}$, $2^{nd}$, $3^{rd}$ ... nth conductors 20 of one of the light-emitting structures S are respectively connected to the soldered pads 201 of the nth ... $3^{rd}$, $2^{nd}$, $1^{st}$ conductors 20 the other light-emitting structure S, to form a plurality of integrated soldered pad structures 201'. Additionally, as shown in FIG. 6B, to increase the soldering area on each soldered pad 201 of each light-emitting structure S, the covering range covered by each soldered pad 201 from the top view must be at least ¼ of a circle, to avoid poor soldering resulting from cutting inaccuracy during sawing process (namely cutting the light-emitting module M in order to separate the two adjacent light-emitting structures S).

It can be seen from the above that the rotation by 180 degrees for one light-emitting structure S relative to the other light-emitting structure S on the plane P makes the side through holes on the interface of two light-emitting structures connect to form a complete circle or a semicircle. The connection between the conductors (namely the soldered pads 201) of the side through holes results in that no intermediate material is created between the two adjacent light-emitting structures S. The utilization ratio of the base 1 is increased. It is worth noting that the base 1 is not limited to the dual layer substrate mentioned above (namely the first substrate 11 and the second substrate pressed to form a dual layered substrate), and the base 1 can be a single layered substrate (namely the front face of the base 1 has chip bond pad 200, the side face and back face of the base 1 have soldered pad 201). Therefore, any design involving two light-emitting structures S connected each other and one is rotated by 180 degrees relative to the other falls under the scope of the instant disclosure.

Figure 7A:
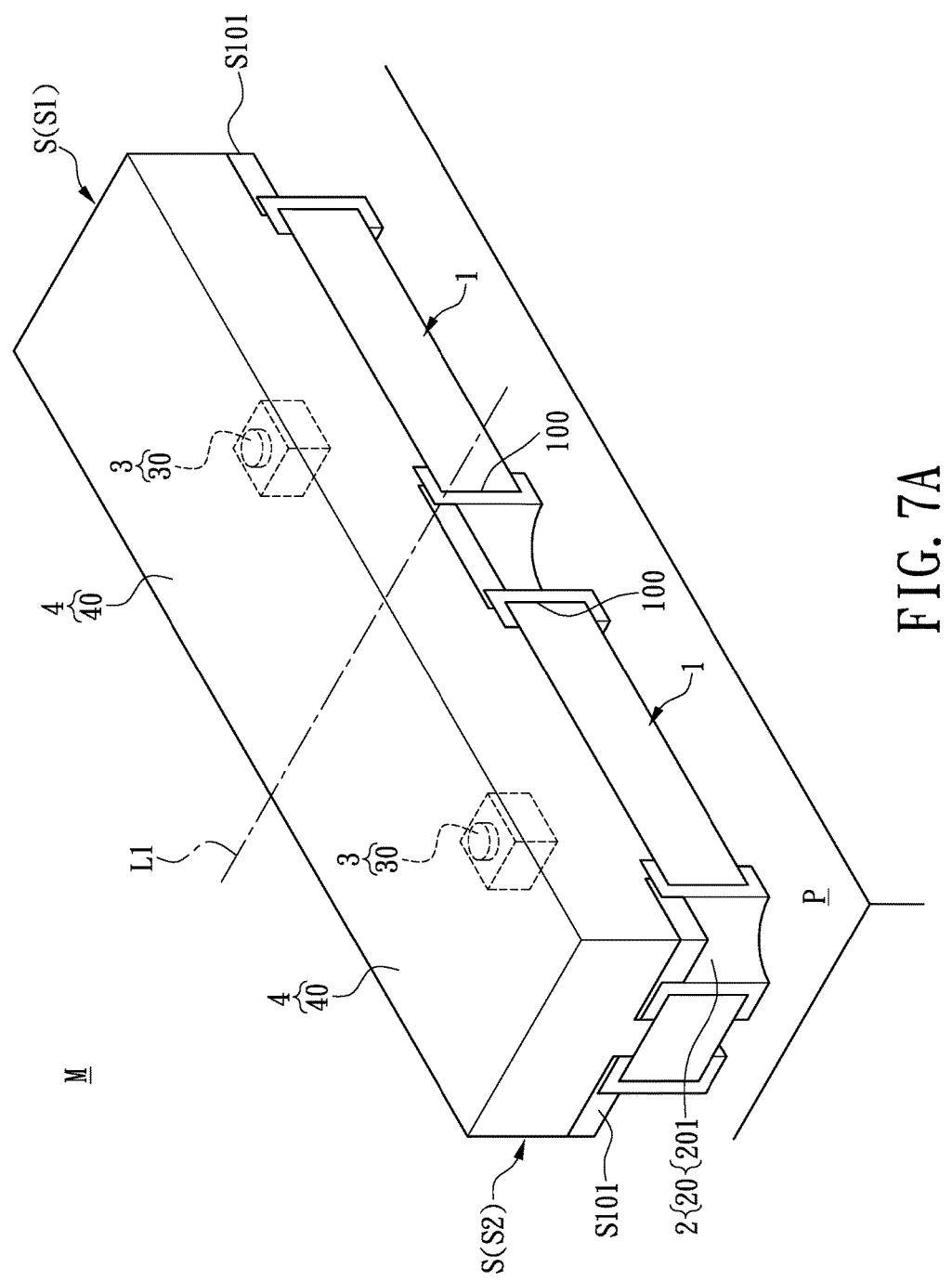
FIG. 7A is a perspective schematic diagram of another light-emitting module before being cut along the common line according to the instant disclosure.
Figure 7B:
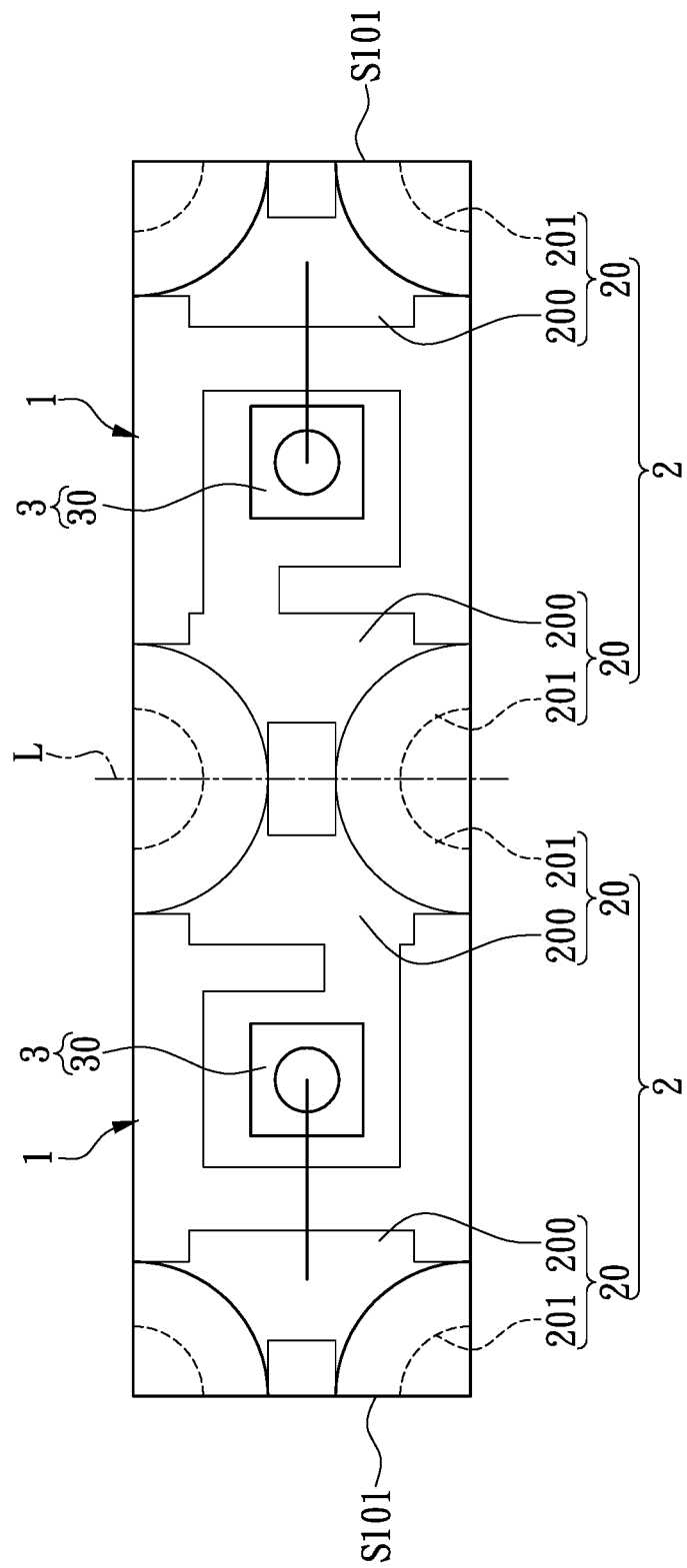
FIG. 7B is a top view schematic diagram after removing the encapsulation element of FIG. 7A according to the instant disclosure.
Figure 7C:
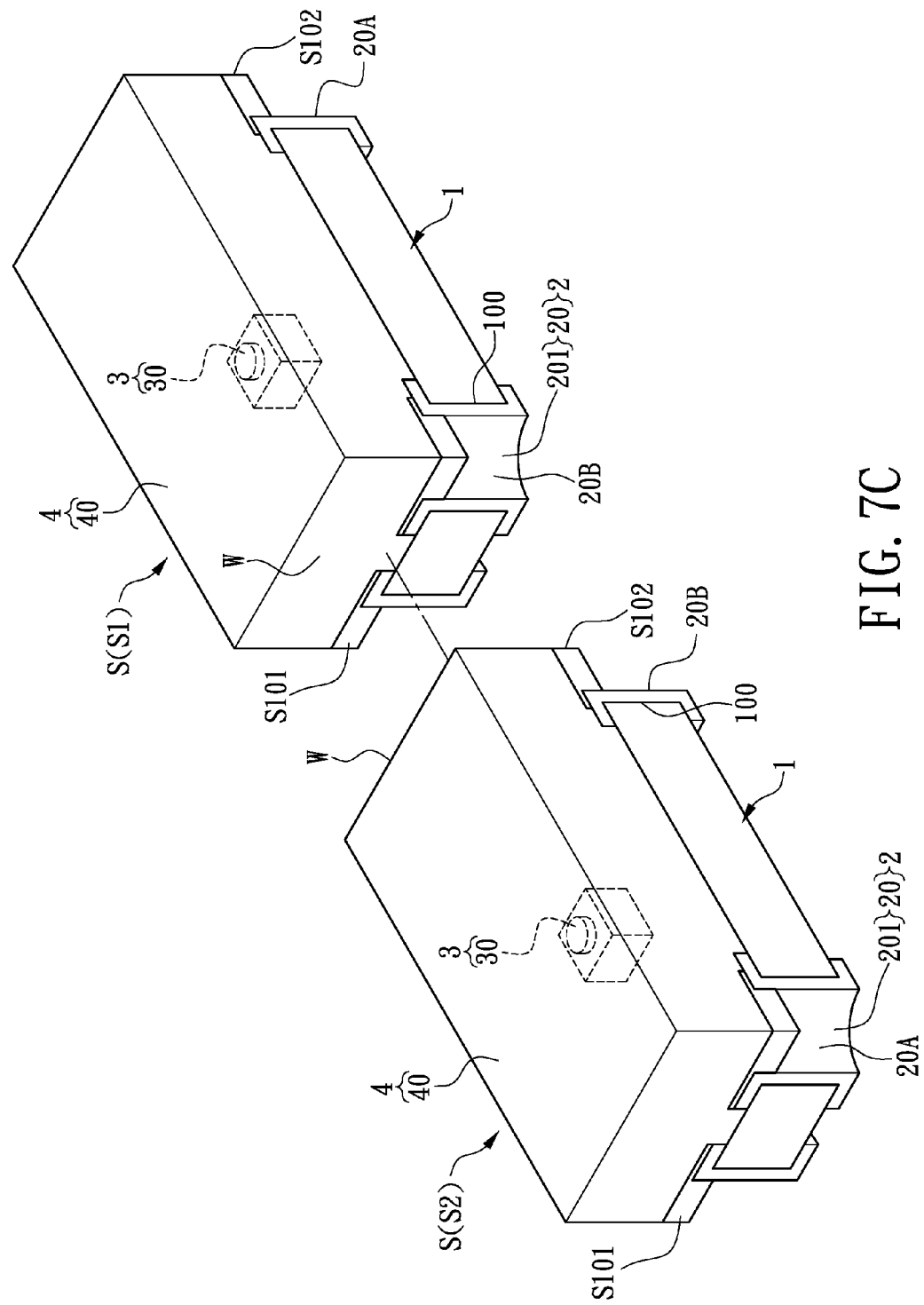
FIG. 7C is a perspective schematic diagram of another light-emitting module after being cut along the common line according to the instant disclosure.

Regarding the light-emitting structure S using a single layer substrate, for example, referring to FIG. 7A to FIG. 7C, the conducting element 2 includes at least two conductors 20 separated from each other and passing through the base 1, and each of the conductors 20 includes a chip bond pad 200 disposed on top of the base 1 and two soldered pads 201 connected to the chip bond pad 200 and extending from the side through holes on the sides of the base 1 to the bottom of the base 1. The light-emitting element 3 includes at least one light-emitting diode chip 30 electrically connected between the two conductors 20. The light-emitting diode chip 30 is electrically between the two chip bond pads 200 of the two conductors 20. The encapsulation element 4 includes a transparent encapsulation body 40 disposed on the base 1 for covering the conducting element 2 and the light-emitting element 3. The transparent encapsulation body 40 is disposed on top of the base 1 for encapsulating the light-emitting element 3 and the chip bond pad 200.

More specifically, when the two light-emitting structures S are disposed on the same plane P, one of the light-emitting structures S on the plane P is rotated by 180 degrees relative to the other light-emitting structure S and the two light-emitting structures are connected to each other. Additionally, each of the light-emitting structures S has a first end S101 and a second end S102 opposite to the first end S101. Each of the light-emitting structure S has at least two conductors 20 which can be sequentially arranged along a direction from the first end S101 to the second end S102, and be sequentially defined as the $1^{st}$ and $2^{nd}$. The $2^{nd}$ conductor 20 of one of the light-emitting structures S is connected to the $2^{nd}$ conductor 20 of the other light-emitting structure S. As shown in FIG. 7B, the two second ends S102 of the two light-emitting structures S are connected to each other (of course, the design can instead connect the $1^{st}$ conductor 20 of one of the light-emitting structures S to the $1^{st}$ conductor 20 of the other light-emitting structure S, in which state the two first ends S101 of the two light-emitting structures S are connected to each other), and the two bases 1 of the two light-emitting structures S are connected to each other. After cutting the light-emitting module M along the common line L1 as shown in FIG. 7A, the light-emitting module M forms two separate light-emitting structures S identical in shape and size (as shown in FIG. 7C). In the present embodiment, two adjacent and similar light-emitting structures S shares common through holes along the short edge of the base to increase the utilization ratio of the base 1. Given that the two light-emitting structures S are disposed adjacently, filtering time needed to separate the intermediate material from the light-emitting structures S is saved. The above uses two conductors as an example, but the instant disclosure is not limited thereto. For example, the amount of conductors can be n, wherein the nth conductor 20 of one of the light-emitting structures S is connected to the nth conductor 20 of the other light-emitting structure S.

Referring to FIG. 7A and FIG. 7C, It is worth noting that the two identical light-emitting structures S are connected to each other with a short edge of the base 1. In addition, the two identical light-emitting structures S can be divided into a first light-emitting structure S1 and a second light-emitting structure S2. The first light-emitting structure S1 has a 1st conductor 20A and a 2nd conductor 20B, the second light-emitting structure S2 has a 1st conductor 20A and a 2nd conductor 20B, and the 2nd conductor 20B of the first light-emitting structure S1 is connected to the 2nd conductor 20B of the second light-emitting structure S2. The first light-emitting structure S1 has a first side through hole 100 formed on the first end S101 thereof, the second light-emitting structure S2 has a second side through hole 100 formed on the second end S102 thereof, and the first side through hole 100 of the first light-emitting structure S1 and the second side through hole 100 of the second light-emitting structure S2 are constructed to formed with at least one half cylinder through hole.

The instant disclosure arranges the light-emitting structures S in pairs adjacent to each other, which shares common through holes on their long edges or short edges to form light-emitting module M. Therefore, when separating the two adjacent light-emitting structures S along their shared through holes on their long or short edges, no intermediate material is crated between the two adjacent light-emitting structures S. Additionally, the shared through holes of the instant disclosure not only can be applied on single layer substrate, but also on multi-layer substrate, all of which can increase the utilization ratio of the substrate.

More specifically, the instant disclosure provides a method of manufacturing a single light-emitting structure S. The method is applicable for light-emitting structure S using single layer substrate or multi-layer substrate. For example, a light-emitting structure S using dual layer substrate is implemented. First, referring to FIG. 1A and FIG. 1B, a light-emitting module M is provided and includes at least two identical light-emitting structures S connected to each other, wherein the at least two light-emitting structures S are disposed on the same plane P, and one of the light-emitting structures is rotated 180 degrees relative to the other light-emitting structure S on the plane P. Additionally, each of the light-emitting structures S has at least one side through hole 100 passing through a side of the base 1, and a conductor 20 (namely the conducting element 2 shown in FIG. 1A and FIG. 1B) is disposed on the side through hole 100, wherein the side through hole 100 on one of the light-emitting structures S is disposed in position corresponding to and connected to the side through hole 100 of the other light-emitting structure S, such that the two conductors 20 of the two light-emitting structures S are connected to each other. Then, as shown in FIG. 2A and FIG. 2B, the light-emitting module M is cut along the common line L1 shown in FIG. 1A and FIG. 1B (namely the light-emitting module M is cut along the common line L1 on the two side through holes 100 of the light-emitting structure S) to separate the at least two light-emitting structures S. More precisely, the light-emitting module M is cut along the long edge of the light-emitting structures S to separate the two of the light-emitting structures S, and the side through holes 100 are located on the long edge of the light-emitting structures S. Two corresponding cutting surfaces W are formed on the at least two light-emitting structures S due to the cutting process is performed (namely two corresponding cutting surfaces W are inherently formed after the light-emitting module is cut along the common line L1). Each of the light-emitting structures is a single light-emitting structure.

In another example, a light-emitting structure S using a single layer substrate is implemented. First, referring to FIG. 7A and FIG. 7B, a light-emitting module M is provided and includes at least two identical light-emitting structures S connected to each other, wherein the at least two light-emitting structures S are disposed on the same plane P, and one of the light-emitting structures is rotated 180 degrees relative to the other light-emitting structure S on the plane P. Additionally, each of the light-emitting structures S has at least one side through hole 100 passing through a side of the base 1, and a conductor 20 is disposed on the side through hole 100, wherein the side through hole 100 on one of the light-emitting structures S is disposed in position corresponding to and connected to the side through hole 100 of the other light-emitting structure S, such that the two conductors 20 of the two light-emitting structures S are connected to each other. Then, as shown in FIG. 7C, the light-emitting module M is cut along the common line L1 shown in FIG. 7A and FIG. 7B (namely the light-emitting module M is cut along the common line L1 on the two side through holes 100 of the light-emitting structure S) to separate the at least two light-emitting structures S. More precisely, the light-emitting module M is cut along the short edge of the light-emitting structures S to separate the two of the light-emitting structures S, and the side through holes 100 are located on the short edge of the light-emitting structures S. Two corresponding cutting surfaces W are formed on the at least two light-emitting structures S due to the cutting process. Each of the light-emitting structures is a single light-emitting structure.

In summary, the instant disclosure has the following advantages. The top surface of the base 1 in the first embodiment of the instant disclosure does not have any through holes, and a dual layer substrate design where a connector 202 and a soldered pad 201 are embedded therein is formed by laminating the first substrate 11 with the second substrate 12. Therefore, the present enclosure can effectively reduce the overall thickness of the light-emitting module M to achieve a thin design.

The plurality of chip bonding pads 200 of the conductors 20 is complete encapsulated by the encapsulation element 4 (such as translucent epoxy resin or translucent silicone resin), permeation of water vapor into the chip bonding pads 200 is reduced, thereby increasing reliability of the product.

The blue LED chip 30B and the green LED chip 30G are disposed directly on top of the first substrate 11 of the base 1, the chip bonding pad for mounting the blue chip 30B and the green LED chip 30G is omitted in the instant disclosure, thereby achieving a thin design. The chip bonding pad 200 for mounting the red chip 30R is offset a predetermined distance from the edge of the first substrate 11 to avoid the risk of short circuit between the chip bonding pad and the soldered pad 201. In order to separate the light-emitting structures S, the chip bonding pad may be exposed outside the encapsulated body due to the cutting inaccuracy, such that the short circuit will be occurred easily.

The center point C2 of the red LED chip 30R is offset a predetermined distance d from the center line L2. Even if the die-attach adhesive (ex. silver gel) coated under the red LED chip 30R is exposed from the encapsulated body, the exposed die-attach adhesive is further away from the soldered pad 201. Therefore, no short circuit occurs due to the die-attach adhesive conducts the electrical path between the chip bonding pad and the solder pad.

No intermediate material is created between the two adjacent light-emitting structures S, the material cost is effectively reduced and time needed in traditional methods for removing intermediate material is saved.

With the above design in mind, generally, the length, width and height of a single light-emitting structure of the instant disclosure are respectively 3.0 mm, 0.4 mm and 1.0 mm. It is worth noting that the instant disclosure successfully reduces the width of the light-emitting structure S to 0.4 mm, satisfying the demand of thin LED. Therefore, the single light-emitting structures S of the instant disclosure can be applied on cell phone indicator, keyboard backlights, or ultrabooks, etc.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A method of manufacturing a single light-emitting structure, comprising the following steps:
   providing a light-emitting module having at least two identical light-emitting structures connected to each other, wherein each of the light-emitting structures has a base and at least one side through hole passing through a side of the base, a conductor is disposed on the at least one side through hole, the at least one side through hole of one of the light-emitting structures is disposed in position corresponding to and connected to the at least one side through hole of the other light-emitting structure, such that the two conductors of the two light-emitting structures are connected to each other; and
   cutting the light-emitting module along a common line on the side through holes to separate at least two of the light-emitting structures, wherein each of the light-emitting structures is single;
   wherein the step of providing the light-emitting module further comprises the step of:
   placing at least two of the light-emitting structures on a plane, wherein one of the light-emitting structures is rotated by 180 degrees relative to a common cutting line defined between the two light-emitting structures.

2. The method according to claim 1, wherein the step of cutting the light-emitting module further comprises the step of:
   cutting along a short edge of the light-emitting structures to separate the at least two of the light-emitting structures, wherein the side through holes are located on the short edge or the long edge of the light-emitting structures.

3. The method according to claim 1, wherein the step of cutting the light-emitting module further comprises the step of:
   cutting along a long edge of the light-emitting structures to separate the at least two of the light-emitting structures, wherein the side through holes are located on the short edge or the long edge of the light-emitting structures.

4. The method according to claim 1, wherein each of the light-emitting structures further comprises:
   a conducting element including N conductors separated from each other and passing through the base, wherein N is greater than 1;
   at least one light-emitting element electrically connected to the N conductors; and
   an encapsulation body disposed on the base for encapsulating the conducting element and the light-emitting element.

5. The method according to claim 4, wherein the two light-emitting structures are connected to each other.

6. The method according to claim 4, wherein each of the light-emitting structures has a first end and a second end opposite to the first end, the first end and the second end respectively are on two opposite vertical faces of the light-emitting structure, the N conductors of one of the light-emitting structures are sequentially arranged along a direction from the first end to the second end, and are defined in order according to an arithmetic sequence as 1st, 2nd, 3rd . . . nth conductors, the N conductors of the other light-emitting structures are sequentially arranged along a direction from the second end to the first end, and are defined in order according to an arithmetic sequence as nth . . . 3rd, 2nd, 1st conductors, and the 1st, 2nd, 3rd . . . nth conductors of one of the light-emitting structures are respectively connected to the nth . . . 3rd, 2nd, 1st conductors of the other light-emitting structure.

7. The method according to claim 6, wherein the first end and the second end of one of the light-emitting structure are respectively connected to the second end and the first end of the other light-emitting structure.

8. The method according to claim 6, wherein each of the conductors includes a chip bond pad disposed on top of the base, a soldered pad exposed at the bottom of the base, and a connector connecting the chip bond pad and the soldered pad, the light-emitting element includes at least one light-emitting diode chip electrically connected between the two chip bond pads of at least two of the N conductors, and the encapsulation body is disposed on top of the base for encapsulating the light-emitting element and the chip bond pad.

9. The method according to claim 8, wherein, the chip bond pads of the 1st, 2nd, 3rd . . . nth conductors of one of the light-emitting structures are respectively separated from the chip bond pads of the nth . . . 3rd, 2nd, 1st conductors of the other light-emitting structure, and the soldered pads of the 1st, 2nd, 3rd . . . nth conductors of one of the light-emitting structures are respectively connected to the soldered pads of the nth . . . 3rd, 2nd, 1st conductors of the other light-emitting structure.

10. The method according to claim 8, wherein the connector has a first connecting portion connected to the chip bond pad and embedded in the base, and a second connecting portion connected between the first connecting portion and the soldered pad.

11. The method according to claim 10, wherein the second connecting portion has an expansion portion which expands at a periphery of the second connecting portion around and away from a region proximal to the first connecting portion.

12. The method according to claim 10, wherein the base includes a first substrate and a second substrate, the second substrate joined to the first substrate through an interconnection layer, the chip bond pad is disposed on top of the first substrate, the soldered pad is disposed on the side and bottom of the second substrate, the first connecting portion of the connector pass through the first substrate, and the second connecting portion of the connector pass through the interconnection layer.

13. The method according to claim 12, wherein the light-emitting element has a red LED chip, a green LED chip and a blue LED chip, two of the LED chips are disposed on top of the first substrate of the base, and the other LED chip is disposed on the chip bond pad of the corresponding conductor.

14. The method according to claim 13, wherein the base has a center line connecting the first end and the second end of the corresponding light-emitting structure, center points of the two LED chips disposed on the first substrate of the base are located on the center line, and a center point of the other LED chip disposed on the chip bond pad of the corresponding conductor is offset from the center line by a predetermined distance.

15. The method according to claim 14, wherein the predetermined distance is substantially 15% of a short edge of the base.

16. The method according to claim 6, wherein the two identical light-emitting structures are divided into a first light-emitting structure and a second light-emitting structure, the first light-emitting structure has a 1st conductor, a 2nd conductor, a 3rd conductor and a 4th conductor, the second light-emitting structure has a 1st conductor, a 2nd conductor, a 3rd conductor and a 4th conductor, the 1st conductor of the first light-emitting structure is connected to the 4th conductor of the second light-emitting structure, the 2nd conductor of the first light-emitting structure is connected to the 3rd conductor of the second light-emitting structure, the 3rd conductor of the first light-emitting structure is connected to the 2nd conductor of the second light-emitting structure, and the 4th conductor of the first light-emitting structure is connected to the 1st conductor of the second light-emitting structure.

17. The method according to claim 6, wherein the two identical light-emitting structures are connected to each other with a long edge of the base.

* * * * *